(12) United States Patent
Sasaki et al.

(10) Patent No.: US 6,515,868 B1
(45) Date of Patent: Feb. 4, 2003

(54) PRINTED CIRCUIT BOARD

(75) Inventors: Hideki Sasaki, Tokyo (JP); Shuichi Oe, Tokyo (JP); Shunji Sato, Tokyo (JP); Takahiko Kikukawa, Tokyo (JP); Hideaki Kobayashi, Tokyo (JP); Takashi Harada, Tokyo (JP); Yuki Takahashi, Miyagi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/688,047

(22) Filed: Oct. 12, 2000

(30) Foreign Application Priority Data

Oct. 15, 1999 (JP) .......................... 11-293672

(51) Int. Cl.⁷ .............................. H05K 7/02; H05K 7/10
(52) U.S. Cl. ................. 361/760; 361/763; 361/765; 361/811; 361/502
(58) Field of Search ................. 361/760, 769, 361/763, 765, 772, 777, 794, 811, 502, 830, 821

(56) References Cited

U.S. PATENT DOCUMENTS 4,479,100 A * 10/1984 Moghe et al. ............. 333/33
5,068,631 A * 11/1991 Vince ....................... 333/181
6,166,457 A * 12/2000 Iguchi et al. ............... 307/91

FOREIGN PATENT DOCUMENTS

| JP | 7-46748 | 5/1995 |
| JP | 9-283974 | 10/1997 |

* cited by examiner

*Primary Examiner*—David Martin
*Assistant Examiner*—Hung Bui
(74) *Attorney, Agent, or Firm*—Sughrue Mion, PLLC

(57) ABSTRACT

Printed circuit board 1 on which LSI2 is mounted comprises first capacitors 4a and 4b for electrically connecting power source terminals 3a and 3b to via holes 8b, first power source wiring 5a, second power source wiring 6a and a second capacitor 7a. In a predetermined frequency range, the characteristic impedances in power source wirings 5a and 6a are set to three times or more higher than the impedances in capacitors 4a, 4b and 7a. In addition, the lengths of power source wirings 5a and 6a are set to equal to or larger than a value obtained by multiplying 20 mm by the wavelength reduction rate of the printed circuit board and equal to or smaller than a value obtained by multiplying one quarter the wavelength at the upper limit frequency in the predetermined frequency range by the wavelength reduction rate.

29 Claims, 17 Drawing Sheets

PRINTED CIRCUIT BOARD

BACKGROUND OF THE INVENTION

1. Field of the Invention

The present invention relates to a printed circuit board mounted on an electronic device, and more particularly to a printed circuit board in which undesired electromagnetic wave radiation (hereinafter referred to as electromagnetic wave radiation) is suppressed.

2. Description of the Related Art

In recent years, as the technology of high-higher speed and higher density electronic apparatus progresses, undesired electromagnetic wave radiation from the electronic apparatus causes problems such as malfunction of electronic devices disposed near the apparatus (for example, fluctuations in image on TV screen). Electronic device manufactures are developing technology to suppress such electromagnetic wave radiation.

The electromagnetic wave radiation results from high-frequency signals transmitted through a printed circuit board. Thus, in order to suppress the radiation of electromagnetic waves from an electronic device, it is effective to apply a countermeasure to a printed circuit board to be mounted on electronic device.

For this reason, various techniques have been developed to suppress electromagnetic wave radiation from printed circuit boards, and a need exists for a technique to suppress the electromagnetic wave radiation at a higher level.

Effective suppressing measures taken for a printed circuit board itself can eliminate, for example, the need to provide a shield plate for covering the printed circuit board, or the need to use an expensive shield cable for a cable connected to the printed circuit board, thereby allowing a significant reduction in cost of products.

As a technique for suppressing the electromagnetic wave radiation for a printed circuit board, Japanese Patent Laid-open No. 9-283974 proposes a low EMI multi-layered circuit board which suppresses strong electromagnetic wave radiation due to resonance of a power source layer and a ground layer in the board.

As shown in FIG. 1, the low EMI multi-layered circuit board comprises a board structure in which first dielectric layer 203 is sandwiched between power source layer 201 and first ground layer 202 to form capacitance C1, second dielectric layer 205 is sandwiched between power source layer 201 and second ground layer 204 to form capacitance C2, and resistor 206 is connected between first ground layer 202 and second ground layer 204.

As to power source layer 201 and first ground layer 202, a serial circuit including resistor 206 and a capacitor (capacitance C2) is connected between them. For power source noise at high frequency, they act as a structure in which only resistor 206 is connected between the two layers 201, 202.

Resistor 206 holds Q value (an index representing the ratio of stored energy to consumed energy) of resonance caused between power source layer 201 and first ground layer 202 at a low level, thereby making it possible to suppress strong electromagnetic wave radiation due to the resonance.

In addition, since the low EMI multi-layered circuit board is configured to suppress the electromagnetic wave radiation by means of the whole of the board, it has, for example, an advantage of easier mounting design around an LSI package.

The low EMI multi-layered circuit board, however, requires a high dielectric layer and a second ground layer in addition to a typical ground layer. Thus, it has problems that it is not obtained by easily changing board design based on normal rules and that the special board structure results in an increase in manufacturing cost.

As another technique for suppressing the electromagnetic wave radiation, Japanese Patent Publication No.7-46748 proposes a printed circuit board which suppresses strong electromagnetic wave radiation due to resonance of a power source layer and a ground layer in the board.

As shown in FIG. 3, the circuit board is configured such that a power source layer within printed circuit board 300 is divided into main power plane 301 and sub-power plane 304, and power source terminals 305 of LSI 303 are electrically connected to sub-power plane 304 and capacitors 306, and power source terminals 305 are electrically connected to ground systems 302 of main power plane 301 through ferrite bead 308 and capacitor 307 (for FB).

The configuration in which power source terminals 305 are electrically connected to main power plane 301 through a π type decoupling circuit comprising capacitor 306, ferrite bead 308 and capacitor 307 (for FB) serves to prevent power source noise from leaking to main power plane 301 from LSI 303, suppressing the electromagnetic wave radiation from main power plane 301.

Printed circuit board 300 has an advantage of easy implementation in terms of design and manufacturing steps since it can be obtained by slightly changing a typical board structure.

However, when an LSI with a number of pins is mounted, a problem occurs that an increased size of sub power plane 304 may cause resonance between sub power plane 304 and the ground layer.

The printed circuit board also has a problem of higher manufacturing cost due to the use of the expensive ferrite bead.

As another technique for suppressing the electromagnetic wave radiation, the present inventors have proposed a printed circuit board which suppresses strong electromagnetic wave radiation caused by resonance of a power source layer and a ground layer in the printed circuit board.

As shown in FIG. 2, the printed circuit board is configured such that power source terminal 405a of IC 404 is electrically connected to common power source wiring 406 of the printed circuit board through a decoupling circuit comprising first capacitor 401, power source wiring 402 and second capacitor 403. The electrodes of first and second capacitors 401, 403 on the ground side are electrically connected to via holes 407a, 407b (ground conductors), respectively.

Ground terminal 405b of IC 404 is electrically connected to via hole 407c (ground conductor).

In the printed circuit board, the characteristic impedance of the power source wiring is set to be sufficiently higher than the impedance in the first capacitor, and the length thereof is set to approximately one quarter the wavelength at the upper limit frequency in a frequency range in the electromagnetic wave radiation. Thus, the power source wiring serves as an inductor with high impedance within the frequency range in the electromagnetic wave radiation to suppress high frequency noise which leaks from the power source terminal to the common power source wiring, resulting in suppression of electromagnetic wave radiation due to resonance of the common power source wiring.

In this manner, since the printed circuit board includes the decoupling circuit formed of the inexpensive capacitors and the power source wiring, the problem of increased cost is not remarkable, and this technique allows low manufacturing cost while harmful electromagnetic wave radiation can be suppressed.

The printed circuit board, however, applies the decoupling circuit to all of the power source terminals in mounting an LSI, so that routing of signal wiring may not be easy in wiring design, in which case a problem occurs that a reduction in design cost cannot be achieved.

To solve the aforementioned problems, it is an object of the present invention to provide a printed circuit board at lower cost and produce higher radiation suppressing effect by improving the printed circuit board shown in FIG. 27 to allow efficient arrangement of decoupling circuits for an LSI having a number of power source terminals.

SUMMARY OF THE INVENTION

To achieve the aforementioned object, a printed circuit board according to a first aspect of the present invention, including ground conductors and a power source conductor, on which an electronic component provided with two or more power source terminals is mounted, comprises: two or more first capacitors for electrically connecting the two or more power source terminals to the ground conductors, respectively, a first power source wiring for electrically connecting electrodes of adjacent first capacitors of the two or more first capacitors on the power source terminal sides, a second power source wiring for electrically connecting at least one of electrodes of the two or more first capacitors on the power source terminal side to the power source conductor, and a second capacitor for electrically connecting the power source conductor electrically connected to the second power source wiring to the ground conductor, wherein the first and second power source wirings have characteristic impedance three times or more higher than the impedance of the first and second capacitors in a frequency range in which undesired electromagnetic wave radiation occurs, and the first and second power source wirings have lengths which are equal to or larger than a value obtained by multiplying 20 mm by the wavelength reduction rate of the printed circuit board and are equal to or smaller than a value obtained by multiplying one quarter-wavelength at the upper limit frequency at which the undesired electromagnetic wave radiation occurs by the wavelength reduction rate.

Since such a configuration enables a reduced number of capacitors and reduced space for mounting, routing of signal wiring is facilitated in wiring design, thereby making it possible to provide a printed circuit board at reduced design cost and produce high effect of suppressing electromagnetic wave radiation.

According to a second aspect, the printed circuit board is configured such that the second power source wiring is electrically connected to the electrode of the first capacitors on the power source terminal side electrically connected to a power source terminal other than the power source terminal with the largest noise out of the power source terminals electrically connected with the first power source wiring.

In this manner, since the second power source wiring is electrically connected to the electrode on the power source terminal side of the first capacitor at least one capacitor away from the first capacitor electrically connected to the power source terminal with the largest noise, a multi-stage decoupling circuit is formed for a power source terminal with large power source noise. Thus, it is possible to provide a printed circuit board capable of further reducing the number of the capacitors and the mounting space with higher effect of suppressing electromagnetic wave radiation.

According to a third aspect, the printed circuit board is configured such that the first power source wiring electrically connects the electrodes of the first capacitors on the power source terminal sides electrically connected to a plurality of the power source terminals provided on one side of the electronic component.

The first power source wiring connects the first capacitors for each side of the electrical component (for example, an electronic component including an active element) to allow easier wiring design.

According to a fourth aspect, the printed circuit board is configured such that the first power source wiring is electrically connected to the electrodes on the power source terminal sides of the first capacitors adjacent to each other at each corner of the electronic component.

The first power source wiring also connects the first capacitors, for each corner of the electrical component in this case (for example, an electronic component including an active element) to allow easier wiring design similarly to claim 3.

According to a fifth aspect, the printed circuit board is configured such that, for the power source terminal susceptible to the power source noise, a decoupling circuit comprises the first capacitor electrically connected to the power source terminal, a third power source wiring electrically connected only to the first capacitor and to the power source conductor, and a third capacitor electrically connected to the power source conductor and to the ground conductor, wherein the third power source wiring has a characteristic impedance three times or more higher than the impedance in the third capacitor in a frequency range in which the undesired electromagnetic wave radiation occurs, and the third power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which the undesired electromagnetic wave radiation occurs by the wavelength reduction rate.

In this manner, individual decoupling circuits are applied to the power source terminal susceptible to noise and to the other power source terminals, thereby making it possible to provide a printed circuit board which can effectively suppress electromagnetic wave radiation in which the influence of power source noise is avoided.

According to a sixth aspect, the printed circuit board is configured such that, for the power source terminal involving large power source noise, a decoupling circuit comprises the first capacitor electrically connected to the power source terminal, a fourth power source wiring electrically connected only to the first capacitor and to the power source conductor, and a fourth capacitor electrically connected to the power source conductor and to the ground conductor, wherein the fourth power source wiring has a characteristic impedance three times or more higher than the impedance in the fourth capacitor in a frequency range in which the undesired electromagnetic wave radiation occurs, and the fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which the undesired electromagnetic wave radiation occurs by the wavelength reduction rate.

As described above, individual decoupling circuits are separately applied to the power source terminal which produces large power source noise and to the other power source terminals, thereby making it possible to provide a printed circuit board which can effectively suppress power source noise, so that a printed circuit board which can suppress electromagnetic wave radiation can be provided.

According to a seventh aspect, the printed circuit board is configured such that an inductor component is used instead of each of the first, second, third and fourth power source wirings.

The use of the inductor component instead of the power source wiring enables a printed circuit board to be provided, wherein only a small mounting space is required and radiation can be suppressed, without increasing cost, even when the length of the power source wiring is limited in wiring design.

According to an eighth aspect, the printed circuit board is configured such that when the spacing between the capacitors or the spacing between the first capacitor and the second, third or fourth capacitor is smaller than a value obtained by multiplying 20 mm by the wavelength reduction rate of the printed circuit board, an inductor components is used instead of the wiring for connecting the capacitors.

Thus, even when the spacing between the capacitors is smaller than the value obtained by multiplying 20 mm by the wavelength reduction rate for ensuring smaller mounting space, by using the inductor component instead of the power source wiring, a printed circuit board can be provided wherein the mounting space can be decreased and radiation can be effectively suppressed at low cost.

DETAILED DESCRIPTION OF THE PREFERRED EMBODIMENTS

A printed circuit board according to each embodiment of the present invention is hereinafter described with reference to the drawings. First, description is made for a structure and effects of a printed circuit board according to a first embodiment of the present invention.

Figure 4:
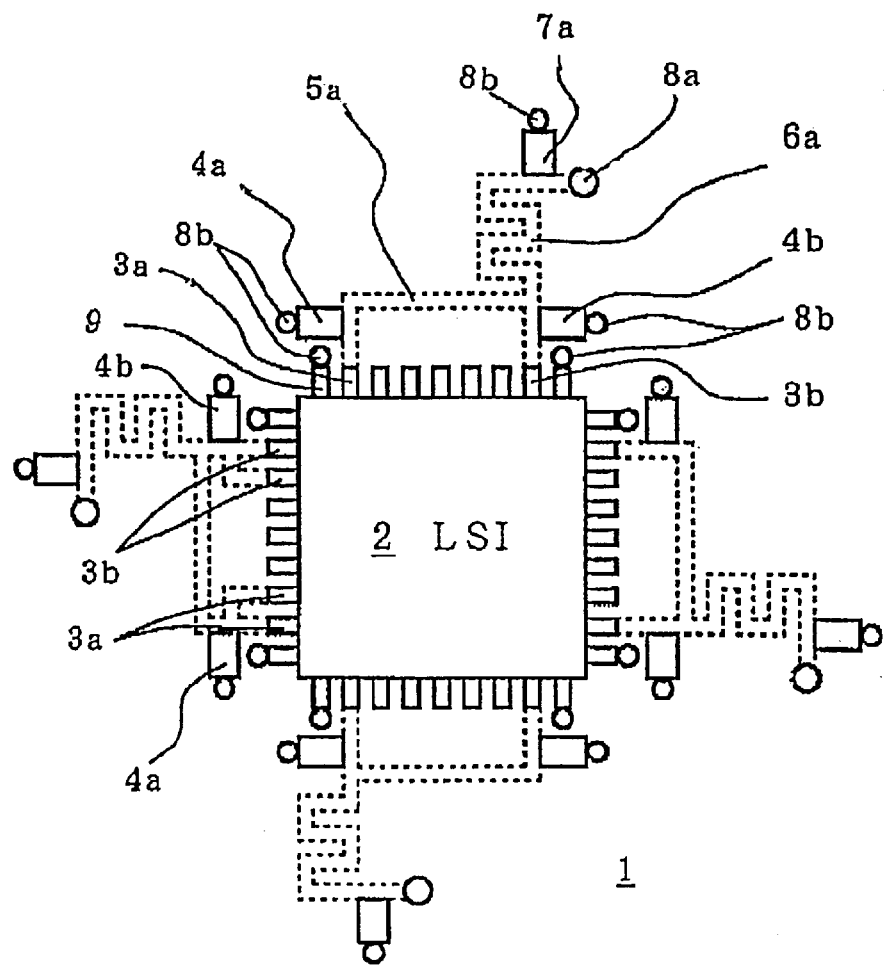
FIG. 4 is a schematic top view of a printed circuit board according to a first embodiment.

FIG. 4 is a schematic top view of the printed circuit board according to the first embodiment.

In FIG. 4, LSI 2 having power source terminals 3a and 3b on each side is mounted on printed circuit board 1. For each side of the package for LSI 12, first capacitors 4a and 4b, first power source wiring 5a, second power source wiring 6a, second capacitor 7a, and via holes 8a and 8b are provided.

Printed circuit board 1 is a multi-layered printed circuit board comprising a signal layer, a power source layer and a ground layer. However, only via hole 8a (a power source conductor electrically connected to a power source layer) and via holes 8b (ground conductors electrically connected to a ground layer) are shown for facilitating the understanding of the configuration.

In printed circuit board 1, first capacitors 4a and 4b electrically connect power source terminals 3a and 3b provided on the same side of LSI 2 to via holes 8b adjacent thereto, and first power source wiring 5a electrically connects electrodes of first capacitors 4a and 4b on the power source terminal sides.

In addition, in printed circuit board 1, second power source wiring 6a electrically connects the electrode of one of capacitors 4a and 4b on the power source terminal side to via hole 8a, and second capacitor 7a electrically connects via hole 8a to via hole 8b adjacent thereto.

LSI 2 is provided with 10 power source terminals 3a and 3b. For example, when two power source terminals 3a and 3b are adjacent to each other as shown on the left side of LSI 2, it is preferable that the two terminals are electrically connected together to one first capacitor 4a or 4b.

In this manner, space can be saved without reducing the effect of suppressing electromagnetic wave radiation.

Electromagnetic wave can be preferably suppressed by using capacitors with a capacitance ranging from 0.001 μF to several tens of μF and with a low series inductance, as first and second capacitors 4a, 4b and 7a.

First and second power source wirings 5a and 6a are designed such that the characteristic impedances thereof are three times or more higher than the impedances of first and second capacitors 4a, 4b and 7a in a frequency range of interest in which undesired electromagnetic wave radiation occurs, and the length thereof may range from 10 mm to 37.5 mm in the case of a glass epoxy resin substrate.

The minimum value 10 mm of the length of power source wirings 5a and 5b was calculated by multiplying 20 mm which was derived from experiments for electromagnetic wave radiation by the wavelength reduction rate (approximately 0.5) of the power source wirings in the glass epoxy resin substrate.

If the wiring length becomes less than this minimum value, a sufficient inductance cannot be obtained for separating LSI 2 from a board power source system at high frequencies.

The maximum value 37.5 mm was calculated by multiplying one quarter the wavelength (75 mm) at the upper limit frequency of 1 GHz, at which undesired electromagnetic wave radiation occurs, by the wavelength reduction rate (approximately 0.5).

If the wiring length becomes greater than this maximum value, electromagnetic wave radiation due to power source resonance may occur in a range above the frequency at which the wavelength becomes equal to one quarter-wavelength.

Thus, in the glass epoxy resin substrate which is a typical printed circuit board, the aforementioned lengths of first and second power source wirings 5a and 6a enable effective suppression of electromagnetic wave radiation.

If the upper limit frequency becomes higher in the future, the maximum value can be made smaller accordingly.

Therefore, power source wirings 5a and 6a serve as an inductor with high impedance in a frequency range of interest in terms of electromagnetic wave radiation by satisfying the aforementioned two conditions, and hence separate LSI 2 is separated from the board power source system, allowing printed circuit board 1 to effectively suppress electromagnetic wave radiation.

Figure 2:
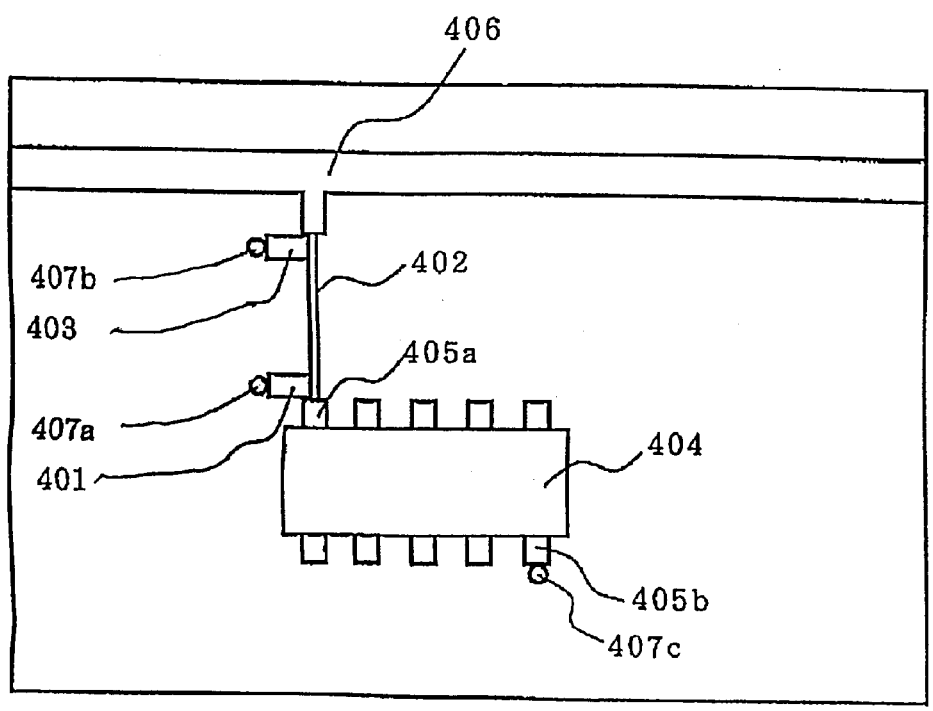
FIG. 2 is a schematic top view of a printed circuit board of a third prior art.

In addition, such a configuration enables a reduction in the number of capacitors and the space for mounting as well as facilitates wiring design, resulting in reduced manufacturing cost of printed circuit board 1, as compared with the prior art in which each power source terminal is provided with two capacitors and one power source wiring shown in FIG. 2.

Also, such a board configuration produces new effects.

Figure 5:
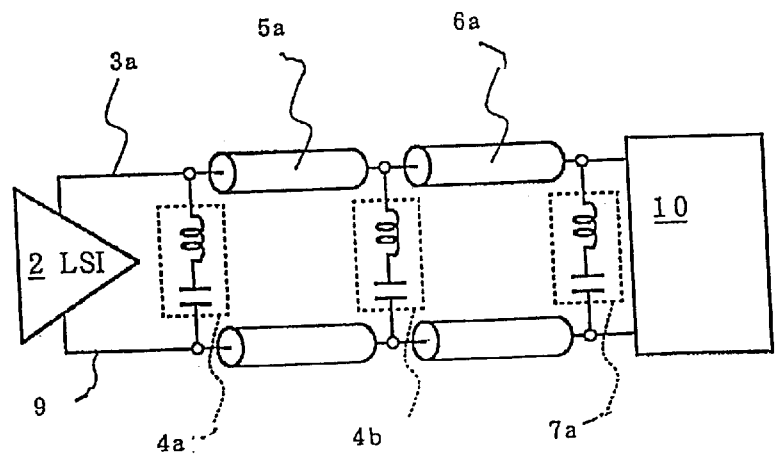
FIG. 5 shows a schematic equivalent circuit of a power source terminal (3a) of the printed circuit board according to the first embodiment.

Specifically, referring to FIG. 5 which shows an equivalent circuit model including power source terminal 3a shown in FIG. 4, since power source terminal 3a and ground terminal 9 are electrically connected to common power source system 10 through a two-stage decoupling circuit, the effect of separating power source terminal 3a from the board power source system (common power source system 10) is increased accordingly to achieve a higher level of suppressing effect of electromagnetic wave radiation.

Studies by the present inventors have shown that large power source noise is generated from a power source terminal near an output buffer with a high operating frequency and a large operating current or from a power source terminal of an internal circuit which produces a clock such as a PLL. The provision of a multi-stage decoupling circuit for such a power source terminal involving large noise allows significantly effective decoupling design to be performed.

Figure 3:
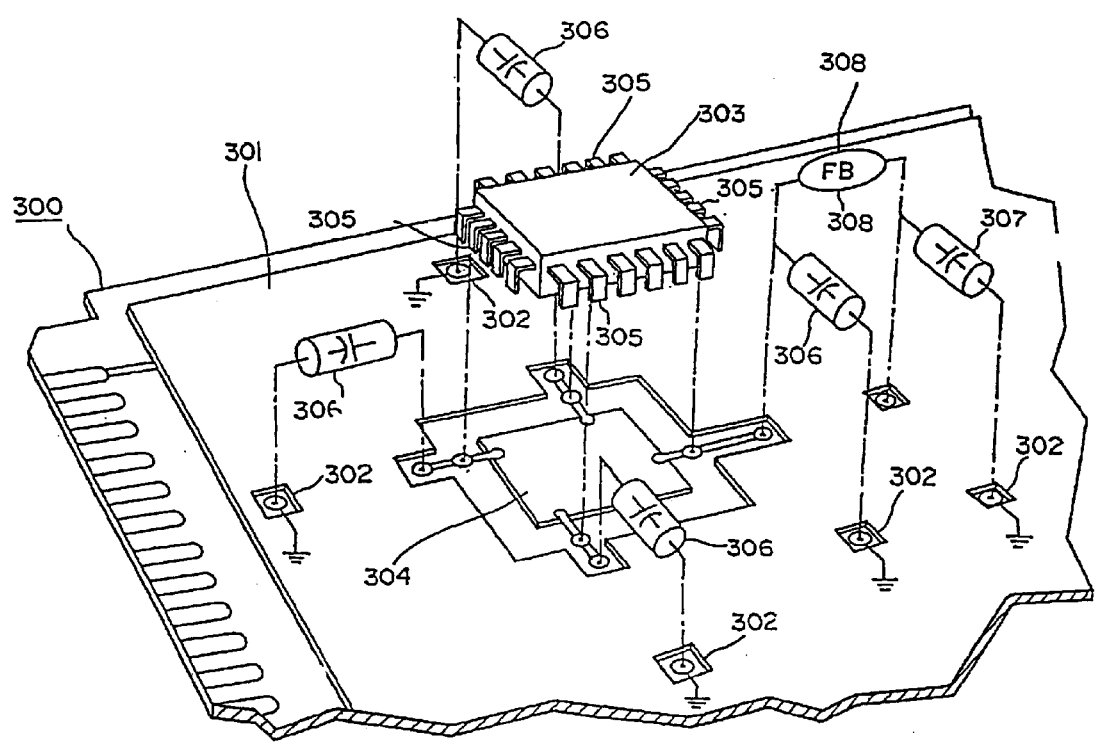
FIG. 3 is a schematic diagram showing a configuration of a printed circuit board of a second prior art.
Figure 8:
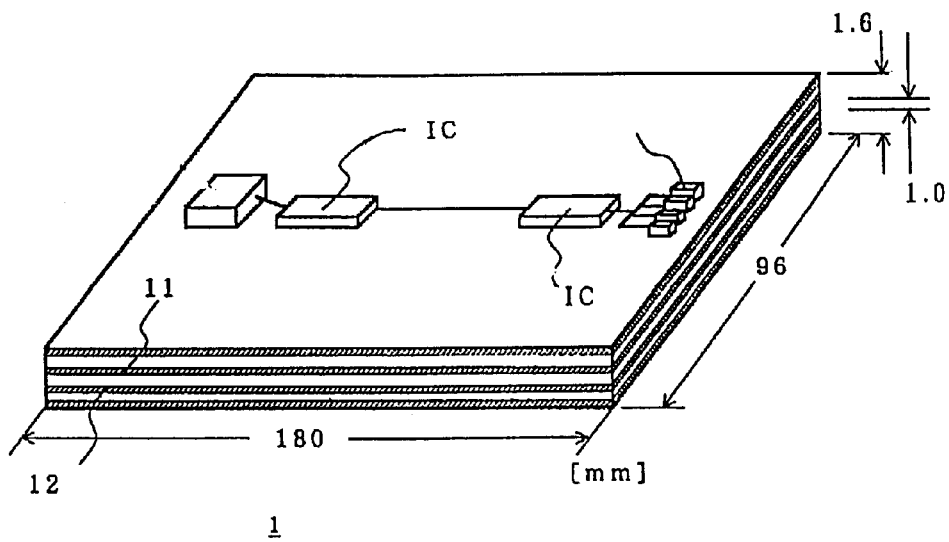
FIG. 8 is a schematic perspective view of a decoupling circuit partially mounted on the printed circuit board of the present invention.

Next, description is made for a printed circuit board on which the decoupling circuit of the present invention is mounted and a printed circuit board of the prior art with reference to FIG. 3 and FIG. 4, followed by description of an example of the printed circuit board in a first embodiment similarly with reference to FIG. 8.

First, description is made for the configuration and radiation suppression effect of a printed circuit board with a decoupling circuit including a capacitor-power source wiring-capacitor arrangement which is a part of the decoupling circuit of the present invention.

Figure 6:
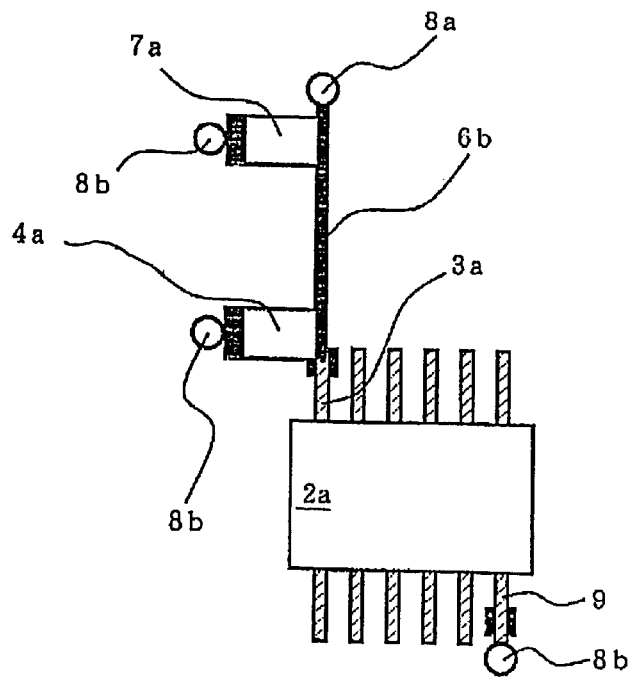
FIG. 6 is a schematic diagram of a decoupling circuit partially mounted on the printed circuit board of the present invention.

As shown in FIG. 6, the decoupling circuit is configured such that first capacitor 4a electrically connects power source terminal 3a of active element 2a to via hole 8b, power source wiring 6b electrically connects the electrode of first capacitor 4a on the power source terminal side to via hole 8a, and second capacitor 7a electrically connects via hole 8a to via hole 8b adjacent thereto.

Ground terminal 9 of active element 2a is electrically connected to via hole 8b.

Figure 7:
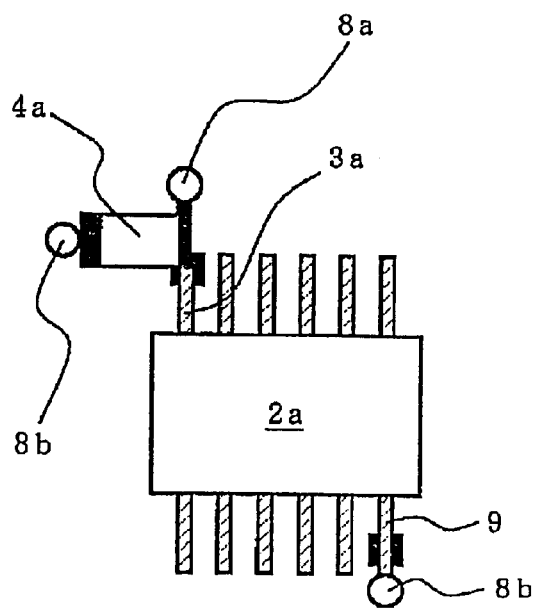
FIG. 7 is a schematic diagram of a mounted decoupling circuit of the prior art.

On the other hand, as shown in FIG. 7, a decoupling circuit in a printed circuit board of a prior art is configured such that first capacitor 4a electrically connects power source terminal 3a of active element 2a to via hole 8b, which configuration obviously differs from that of the decoupling circuit of the present invention.

In FIG. 8, a printed circuit board on which part of the decoupling circuit of the present invention is mounted is shown as four-layer printed circuit board 1 to which the decoupling circuit is applied.

A first layer and a fourth layer are a top surface and a bottom surface of printed circuit board 1, respectively. A second layer and a third layer which are located internally are ground layer 11 and power source layer 12, respectively, and comprise conductor planes.

The first layer is provided with a signal system circuit and a decoupling circuit. A quartz oscillator at 20 MHz, a transmission IC (HC244) and a reception IC (HC244) are mounted as active elements of the signal system circuit, and each of them is provided with the decoupling circuit shown in FIG. 6.

Specifically, a chip capacitor with a capacitance of 0.1 μF and a series inductance of 1.2 nH, not shown, is used as each of capacitors 4a and 7a.

Printed circuit board 1 has an outer dimension of a width of 180 mm, a length of 96 mm, and a thickness of 1.6 mm, with a distance of 1 mm between ground layer 11 and power source layer 12. As power source wiring 6b, a microstrip line with a width of 0.2 mm and a spacing to the ground layer of 0.2 mm is used. As the material of the board, a typically used glass epoxy resin is utilized.

The resultant wiring has a characteristic impedance of approximately 64 ohm which is sufficiently higher than the impedance 7.5 ohm of the chip capacitor at the upper limit frequency 1 GHz of interest in terms of undesired electromagnetic wave radiation.

The line length was set to 10 mm for radiation measurement and 35 mm for impedance calculation, later described.

The value 10 mm corresponds to a value obtained by multiplying 20 mm by the wavelength reduction rate 0.5. The value 35 mm corresponds to a value obtained by multiplying approximately one quarter the wavelength at the upper limit frequency 1 GHz of interest by the wavelength reduction rate 0.5.

Next, description is made for the radiation field characteristics of the boards provided with the decoupling circuits with reference to Figs.

Figure 9:
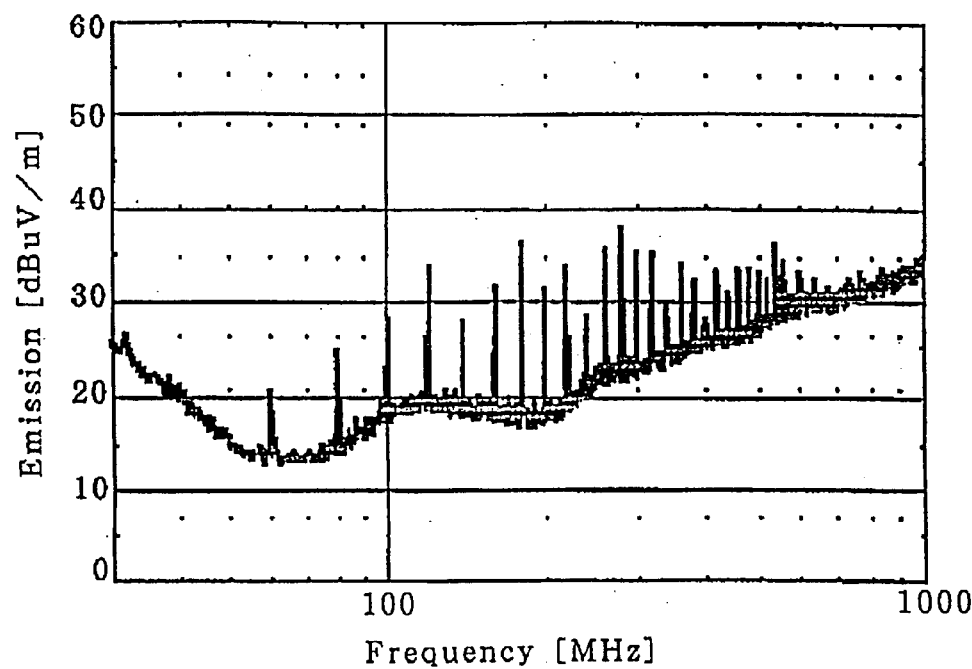
FIG. 9 shows radiation field characteristics of the printed circuit board on which a part of the decoupling circuit of the present invention is mounted.
Figure 10:
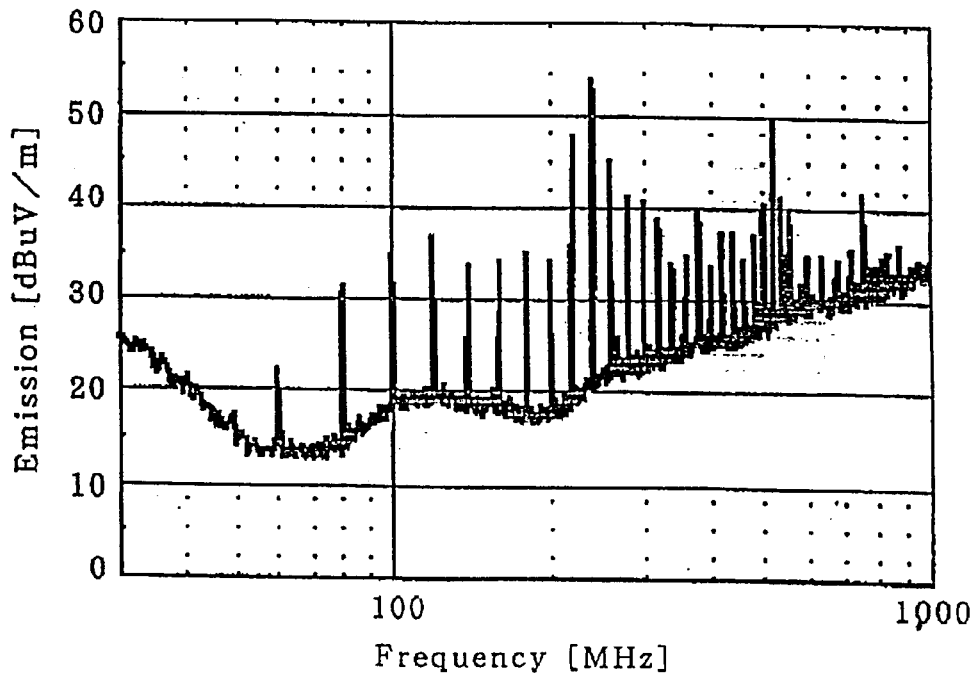
FIG. 10 shows radiation field characteristics of the printed circuit board of the prior art.

FIG. 9 shows the radiation field characteristics of the printed circuit board on which the part of the decoupling circuit of the present invention is implemented. FIG. 10 shows the radiation field characteristic of the printed circuit board in the prior art.

For each radiation field characteristic, only a vertically polarized wave at a high radiation level is shown.

The radiation field characteristics were measured in an anechoic chamber having six walls provided with radio wave absorbers.

Specifically, an antenna was fixed at a height of 130 cm and each printed circuit board was arranged on a table made of wood at a height of 80 cm in parallel with a floor, and while the table was rotated by a turntable, the maximum value of an electromagnetic wave was measured at a point 3 m away therefrom.

As shown in FIG. 10, radiation peaks appear at approximately 240 MHz and 520 MHz in the radiation field characteristic of the printed circuit board in the prior art, but as shown in FIG. 9, such a radiation peak is not seen in the radiation field characteristic of the printed circuit board on which part of the decoupling circuit of the present invention is mounted.

In this manner, it can be realized that the decoupling circuit of the present invention effectively suppresses electromagnetic wave radiation in the printed circuit board.

Next, the difference in the radiation characteristic is described with the impedance characteristic of the power source system of each printed circuit board.

Figure 11:
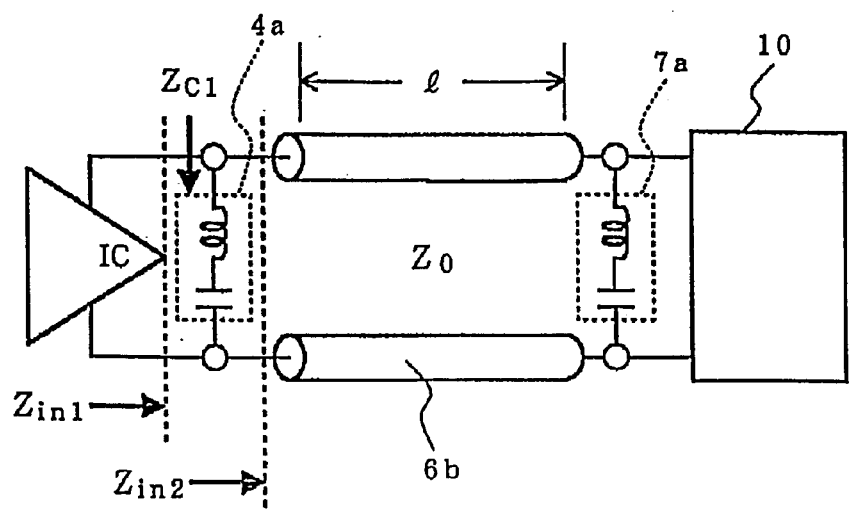
FIG. 11 shows an equivalent circuit model of a power source system of the printed circuit board on which a part of the decoupling circuit of the present invention is mounted.
Figure 12:
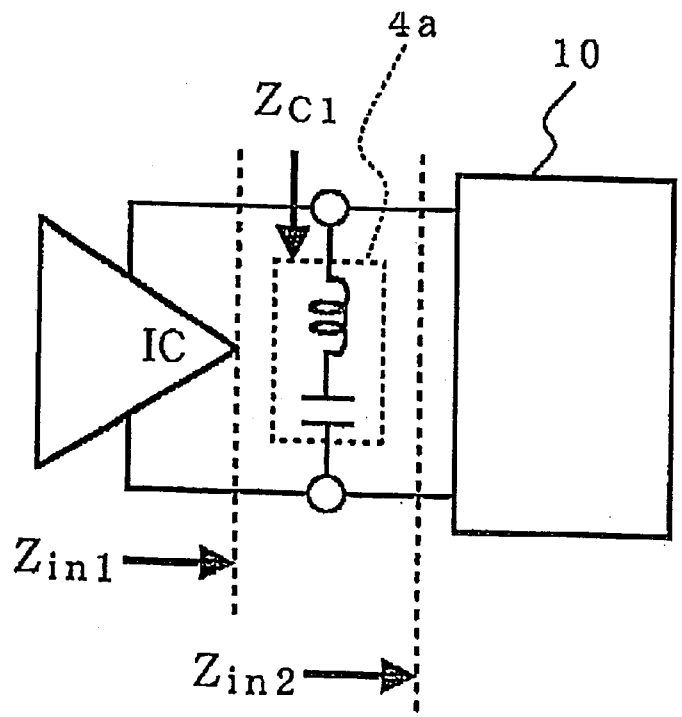
FIG. 12 shows an equivalent circuit model of a power source system of the printed circuit board of the prior art.

FIG. 11 shows an equivalent circuit model of the power source system of the printed circuit board on which the decoupling circuit of the present invention is mounted. FIG. 12 shows an equivalent circuit model of the power source system of the printed circuit board of the prior art.

The input impedance viewed from the transmission IC toward common power source system 10 is shown as Zin1, the impedance characteristic of first capacitor 4a as ZC1, and the input impedance of the circuit after capacitor 4a as Zin2.

Common power source system 10 comprising power source layer 12 and ground layer 11 is handled as a transmission line involving a loss.

ZC1 includes not only the impedance of the capacitor component itself but also the inductance and resistance of pads or via holes for electrically connecting the capacitor to power source layer 12 and ground layer 11.

FIG. 10 shows the calculation results of the impedance characteristic of the printed circuit board on which the decoupling circuit of the present invention is mounted. FIG. 11 shows the calculation results of the impedance characteristic of the printed circuit board of the prior art.

It can be seen from the calculation results of the impedance characteristic of the printed circuit boards that impedance ZC1 of capacitor 4a serves as a capacitance at up to approximately 17 MHz, but serves as an inductance in a higher frequency range due to the series inductance.

It can be seen from the calculation results of the impedance characteristic in the prior art shown in FIG. 11 that Zin2 shows substantially the same characteristic as that of ZC1 at up to approximately 200 MHz, but in a higher frequency range, a characteristic of repeated inductance and capacitance is shown.

This is because the parallel plates comprising power source layer 12 and ground layer 11 act as a transmission line as a frequency is higher.

Specifically, ZC1 serves as an inductance and Zin2 serves as a capacitance, and Zin1 is at a high level at the frequency where the levels of both match.

This is caused by parallel resonance of ZC1 and Zin2 and leads to the peaks of the radiation as mentioned above.

Figure 13:
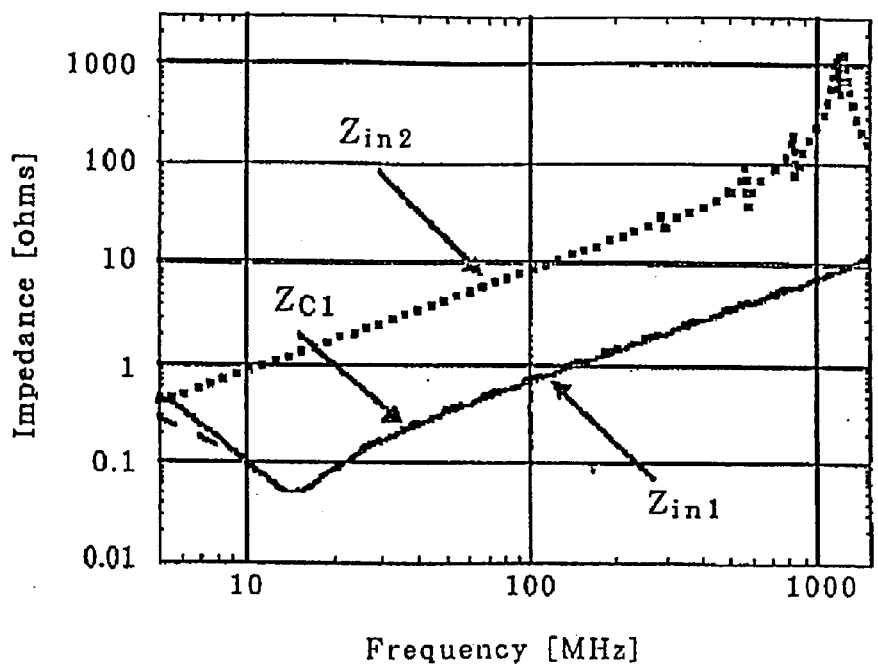
FIG. 13 shows the calculation results of impedance characteristics of the printed circuit board on which a part of the decoupling circuit of the present invention is mounted.

In contrast, it is seen from the calculation results of the impedance characteristic in the part of the decoupling circuit of the present invention shown in FIG. 13 that Zin2 is sufficiently larger than ZC1.

Thus, the resonance in common power source system 10 appears at approximately 300 MHz, 550 MHz and 800 MHz in Zin2, but does not appear in Zin1.

In this manner, it can be seen that the decoupling circuit of the present invention separates the transmission IC serving as an active element from common power source system 10 at high frequencies by setting the input impedance on common power source system 10 side after capacitor 4a at a high level to prevent excitation of common power source system 10 even if it acts as a resonance circuit, thereby suppressing electromagnetic wave radiation due to power source resonance.

It should be noted that similar calculation results were obtained for the quartz oscillator and the reception IC, although not shown.

Zin2 in FIG. 10 acts as an inductance at up to approximately 1 GHz, and as a capacitance at higher frequencies.

This is because the length of the power source wiring in the decoupling circuit was set to 35 mm corresponding to approximately one quarter the wavelength at 1 GHz in consideration of the wavelength reduction rate 0.5 of the printed circuit board.

For example, if the wiring length is increased, Zin2 is increased at lower frequencies, but in a range above the frequency corresponding to one quarter the wavelength, Zin2 is reduced as a frequency is higher, and intersects ZC1 serving as an inductance, causing resonance at the frequency corresponding to the intersection.

In other words, for preventing resonance in a range up to 1 GHz, the length is desirably set to one quarter the wavelength at the maximum.

Next, the effect of suppressing electromagnetic wave radiation in the printed circuit board in the first embodiment is described with reference to FIG. 15 to FIG. 19.

Figure 15:
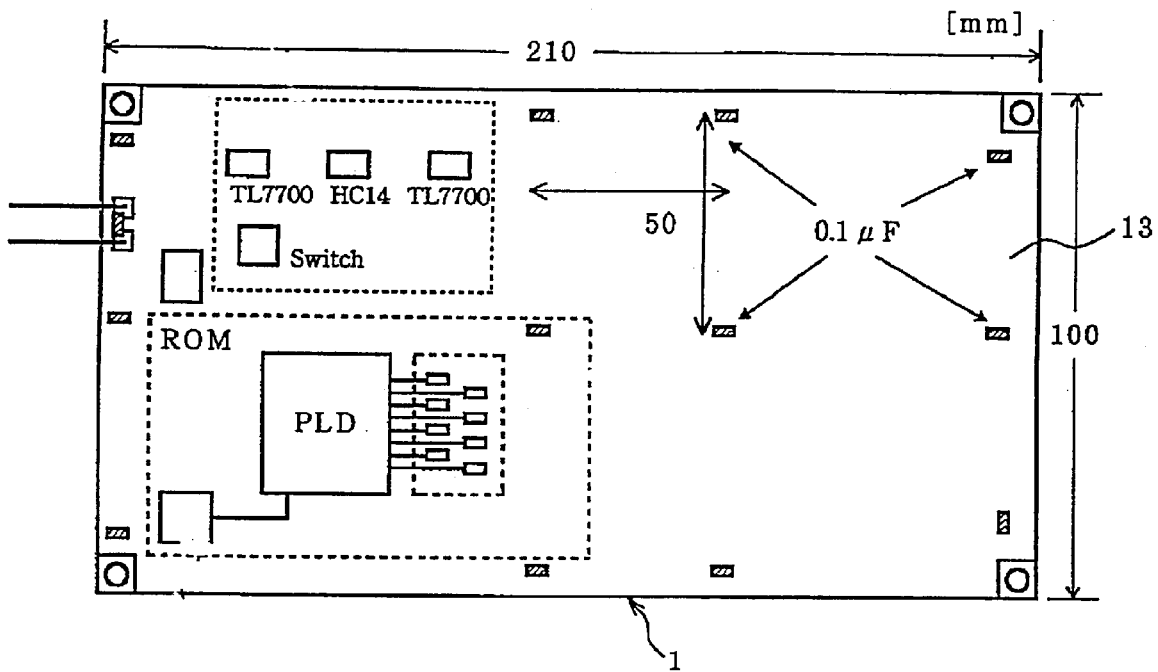
FIG. 15 is a schematic plan view of the printed circuit board of the first embodiment.
Figure 16:
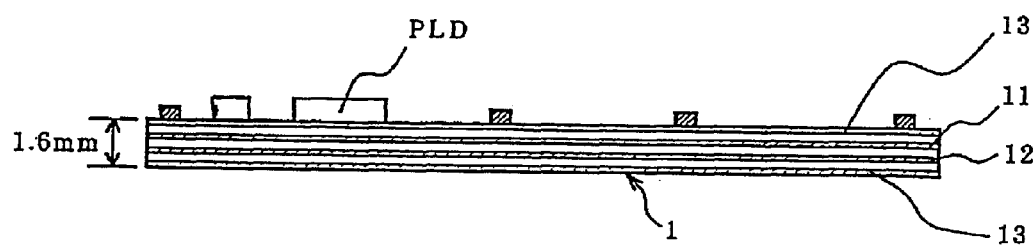
FIG. 16 is a schematic sectional view of the printed circuit board of the first embodiment.
Figure 17:
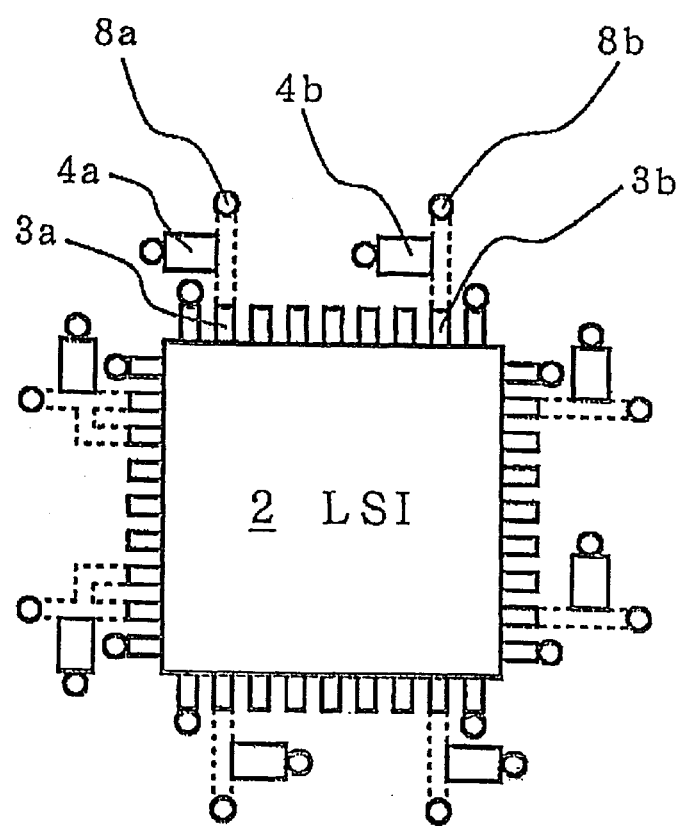
FIG. 17 is a schematic top view of a printed circuit board of the prior art.

FIG. 15 is a schematic plan view of a four-layer board used for estimation, and FIG. 16 is a schematic sectional view thereof.

A first layer and a fourth layer are signal layers 13. A second layer is ground layer 11 and a third layer was power source layer 15, which are comprised of conductor planes.

A glass epoxy resin with a dielectric constant of 4.7 was used as a board material.

A quartz oscillator, a programmable logic device (referred to as "PLD"), a capacitance and an initializing circuit constitute a signal system circuit. The decoupling circuit of the first embodiment of the present invention was provided for the PLD.

Specifically, 208 pin Plastic QFP manufactured by ALTERA (with 21 power source terminals) is used for the PLD. While FIG. 4 shows only 10 power source terminals arranged, the decoupling circuit based on this principle is provided for all of 21 power source terminals 3a.

This also applies to decoupling circuits described later.

The circuit was configured such that a clock signal at 40 MHz is inputted to the PLD from the quartz oscillator, and 0101 pattern is outputted to the capacitance comprising 7-pF 16 capacitors simulating the next stage LSI.

Printed circuit board 1 (210 mm in width, 100 mm in length, and 1.6 mm in thickness) is provided with a copper foil as a shield for covering the quartz oscillator, the PLD and the capacitance in order to estimate only the radiation characteristic caused by the power source system.

Figure 1:
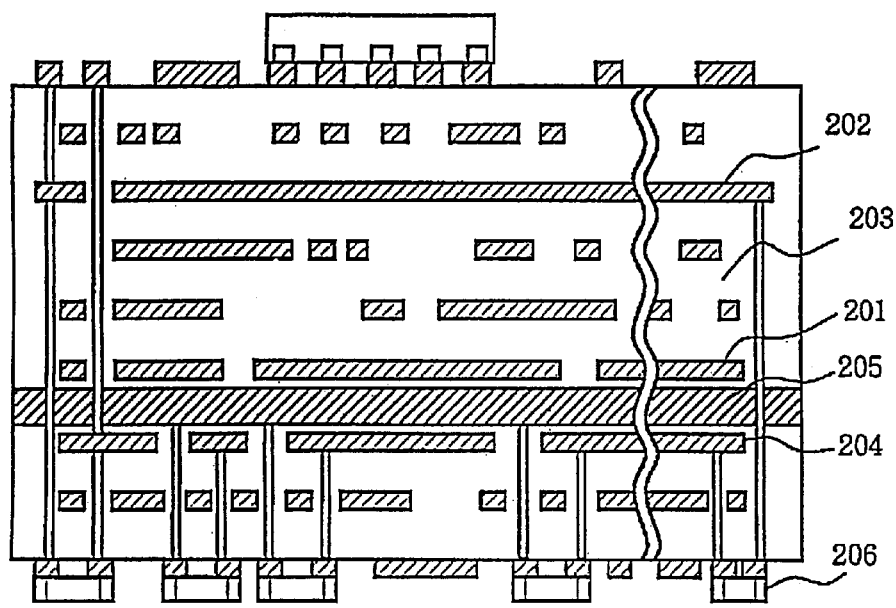
FIG. 1 is a schematic sectional view of a multi-layered printed circuit board of a first prior art.

In printed circuit board 1, as the decoupling circuit shown in FIG. 1, a 0.1-$\mu$F chip capacitor is used for each of capacitors 4a, 4b and 7a, and first and second power source wirings 5a and 6a are designed to have a width of 0.2 mm and a dielectric thickness of 0.2 mm, thus a characteristic impedance of 64 ohm. This value is sufficiently higher than the impedance 7.5 ohm of the 0.1 $\mu$F-chip capacitor at 1 GHZ.

All of the wiring lengths was set to 30 mm.

Figure 14:
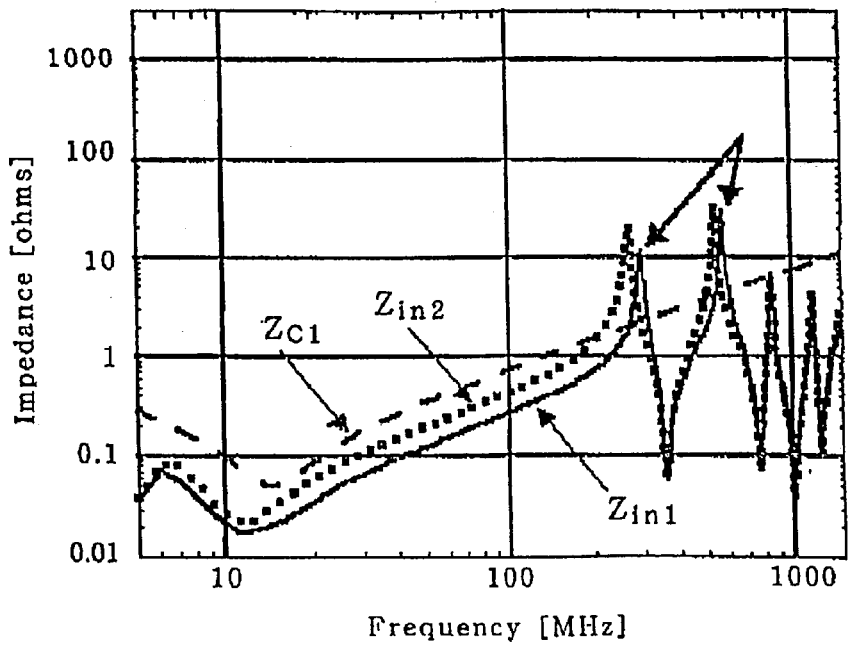
FIG. 14 shows the calculation results of impedance characteristics of the printed circuit board of the prior art.

A printed circuit board in the prior art for comparison and estimation was provided with a decoupling circuit shown in FIG. 14.

The printed circuit board in the prior art includes only 0.1 $\mu$F-capacitor 4a for each power source terminal 3a mounted as a decoupling circuit, and is the same as that shown in FIG. 7 in terms of the principle.

The radiation characteristics of these printed circuit boards are measured as in the aforementioned radiation characteristic measuring method.

Figure 18:
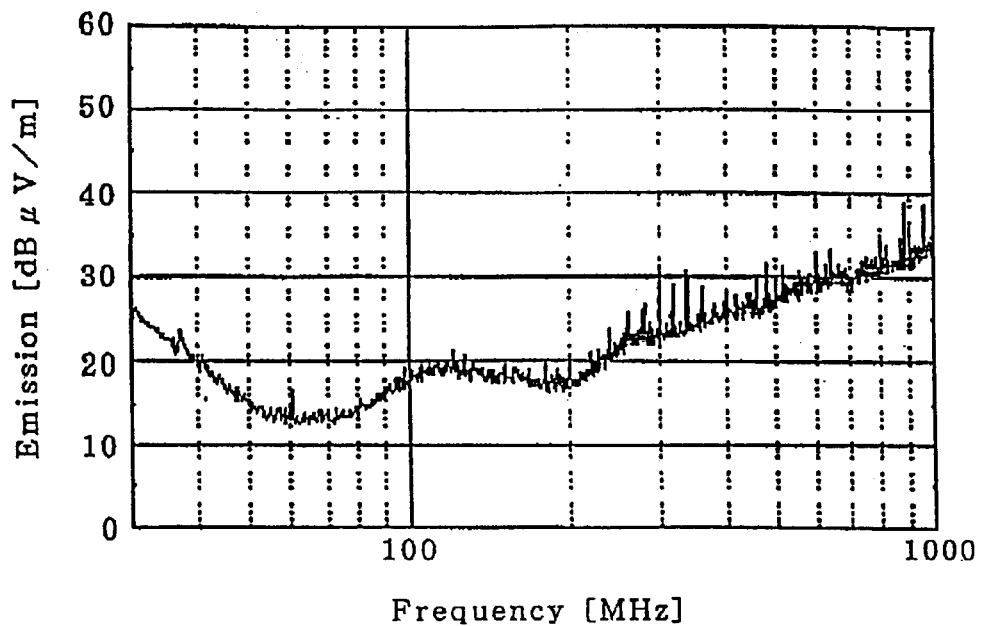
FIG. 18 shows radiation field characteristics of the printed circuit board of the first embodiment.
Figure 19:
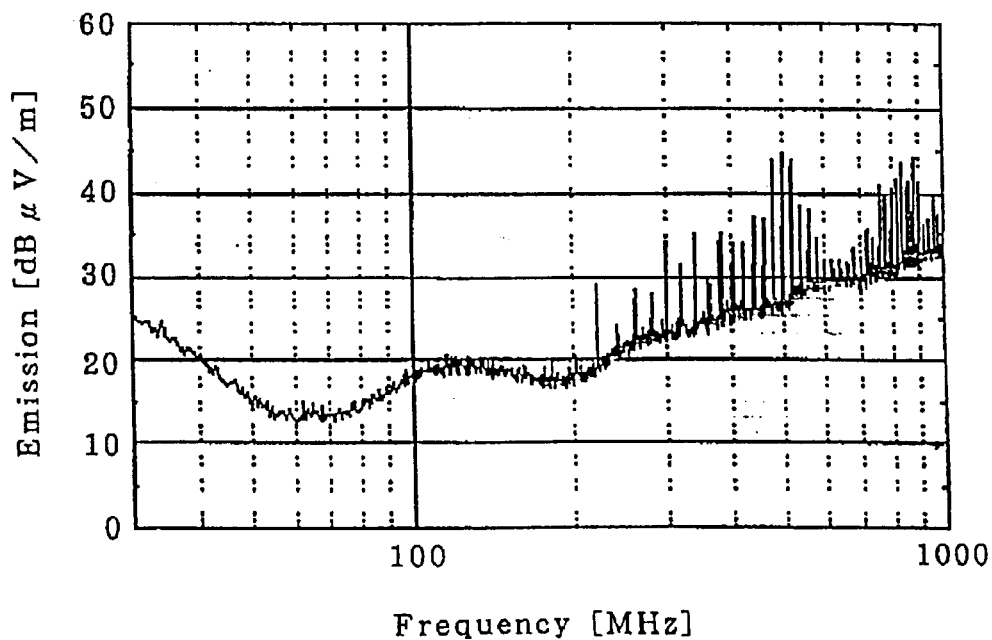
FIG. 19 shows radiation field characteristics of a printed circuit board of the prior art.

FIG. 18 shows the radiation field characteristic of the printed circuit board in the first embodiment, and FIG. 19 shows the radiation field characteristic of the printed circuit board in the prior art.

For the radiation characteristic of each printed circuit board, only a vertically polarized wave at a high level is shown.

In addition, the impedance characteristics of the power source systems are calculated similarly to those in FIG. 13 and FIG. 14. Those calculation results show that resonance appears at approximately 500 MHz and 800 MHz in the board as shown in FIG. 19, but such a peak does not appear in the board as shown in FIG. 18.

Next, a printed circuit board of a second embodiment is described with reference to FIG. 20.

Figure 20:
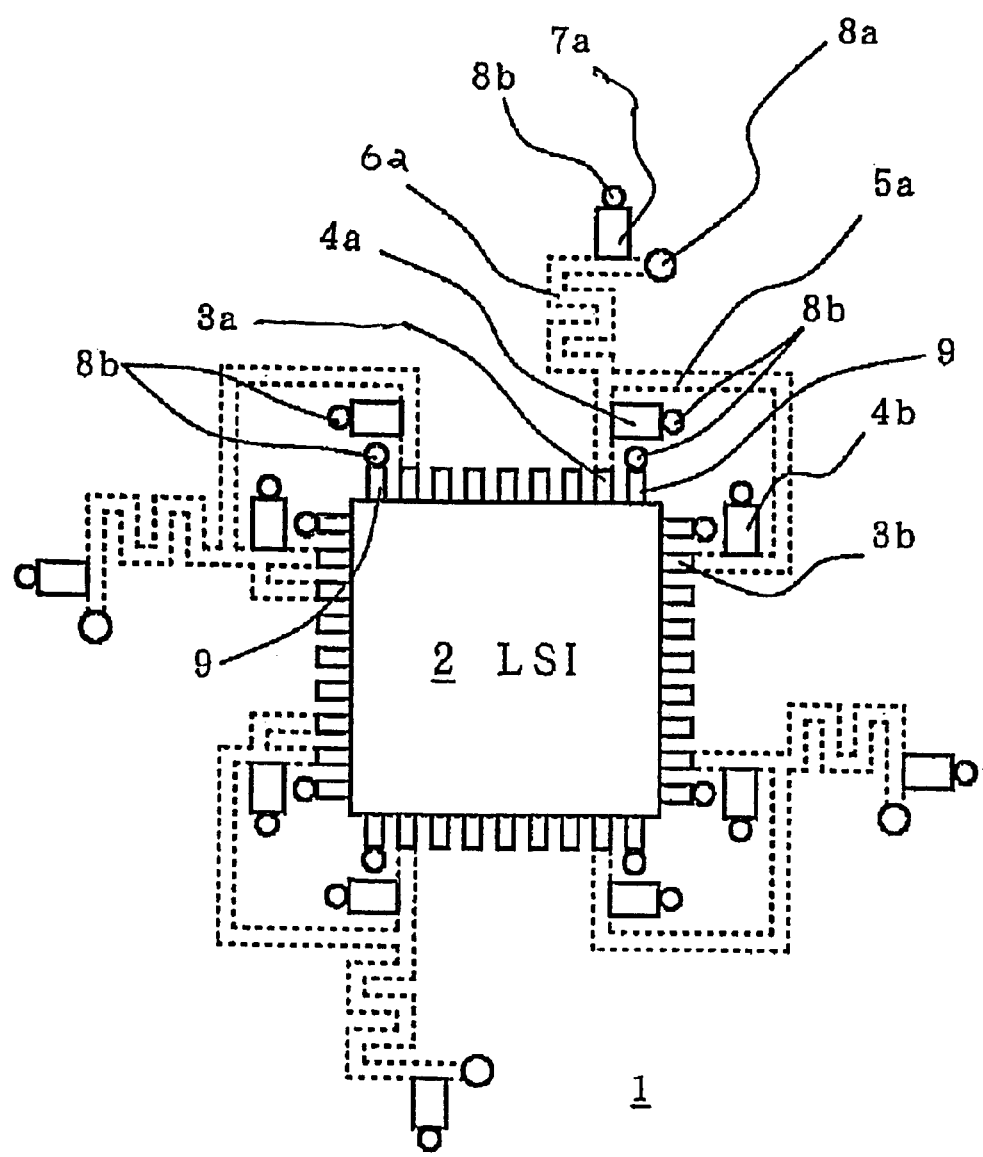
FIG. 20 is the schematic top view of the printed circuit board according to a second embodiment.

FIG. 20 is a schematic top view of the printed circuit board in the second embodiment.

In FIG. 20, first power source wiring 5a electrically connects power source terminals 3a and 3b located on two adjacent sides around each corner of LSI 2 to electrodes of first capacitors 4a and 4b on the power source terminal sides.

The difference in configuration between this printed circuit board and printed circuit board 1 in FIG. 4 is the arrangement of an entire decoupling circuit at each corner, not on each side.

This configuration facilitates routing of signal wiring near the center of each side of the LSI 2 package in performing wiring design of printed circuit board 1 to allow a reduction in time taken for design, resulting in a reduction in manufacturing cost.

While the aforementioned first embodiment and second embodiment illustrate printed circuit boards 1 configured to arrange the entire decoupling circuit on each side and at each corner of the LSI 1 package, respectively, the present invention is not limited to the two configurations. Either of them may be employed partially for routing of signal wiring in wiring design, or the configurations may be applied only to some of the power source terminals.

Specifically, the point of the present invention is that a plurality of first capacitors are electrically connected with a first power source wiring, and one of the first capacitors is electrically connected to a common power source system through a second power source wiring and thorough a second capacitor, thereby making it possible to apply a decoupling circuit comprising a capacitor-power source wiring-capacitor arrangement to the power source terminal with a reduced number of the capacitors as well as a reduced number of wirings.

In addition, the electrical connection of the resulting multi-stage decoupling circuit part to a power source terminals involving large noise can further enhance the effect of suppressing electromagnetic wave radiation.

Next, description is made for the configuration of a printed circuit board according to a third embodiment of the present invention.

Figure 21:
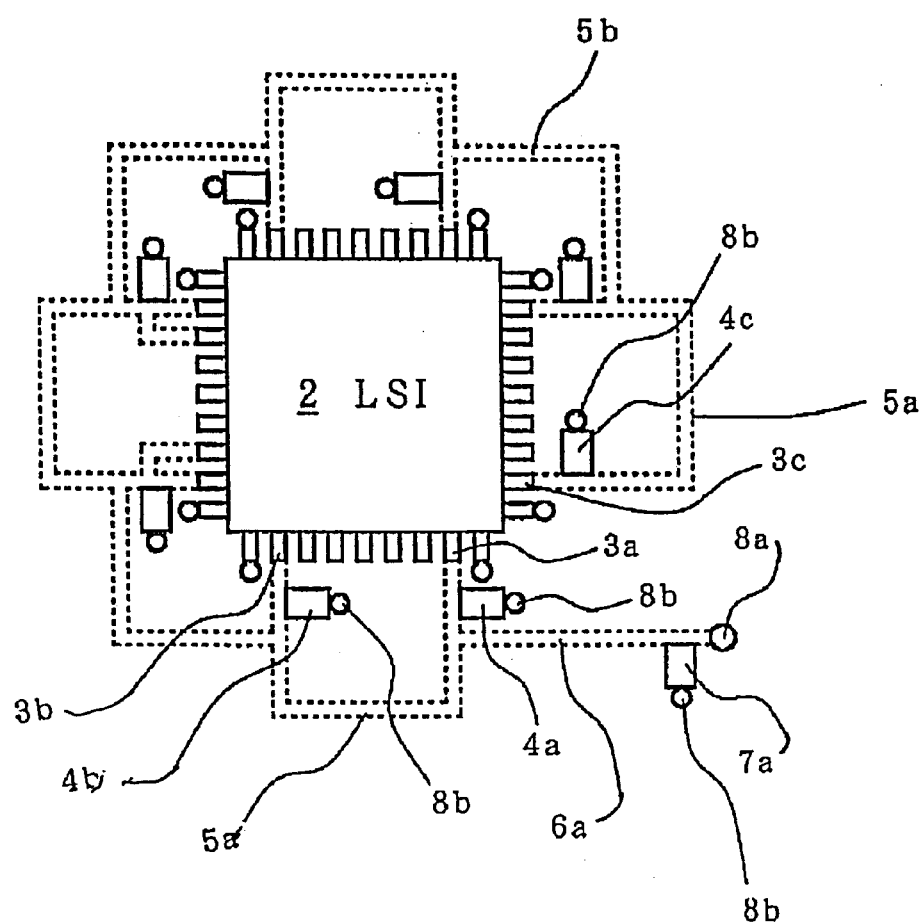
FIG. 21 is the schematic top view of the printed circuit board according to a third embodiment.

FIG. 21 is a schematic top view of the printed circuit board according to the third embodiment.

In FIG. 21, in printed circuit board 1, first capacitors 4a, 4b and 4c electrically connect 10 power source terminals 3a, 3b and 3c to via holes 8b (ground layer) adjacent thereto. First power source wiring 5a electrically connects electrodes of the first capacitors on the power source terminal sides for each side. First power source wiring 5b electrically connects all the adjacent first capacitors expect for first capacitor 4a and 4c. Also, second power source wiring 6a electrically connects the electrode of first capacitor 4a on the power source side to via hole 8a (power source layer), and second capacitor 7a electrically connects via hole 8a (power source layer) to via hole 8b (ground layer).

Therefore, each of power source terminals 4a, 4b and 4c is electrically connected to via hole 8a (power source layer) through an at least one-stage decoupling circuit.

Thus, an eight-stage decoupling circuit can be provided by disposing, for example, the power source terminal with the largest noise at the position of power source terminal 3c.

In this manner, according to the third embodiment, a power source terminal with large power source noise can be electrically connected to the power source system through a multi-stage decoupling circuit.

The features of the configuration are that the number of capacitors used can be reduced and a multi-stage decoupling circuit is applicable to a power source terminal involving large noise with higher electromagnetic wave suppression effect.

Next, the effect of suppressing electromagnetic wave of the printed circuit board in the third embodiment is described with reference to FIGS. 22 and 23.

Printed circuit boards, not shown, as described in the third embodiment shown in FIG. 21 were produced with the same wiring dimensions as those of the first embodiment, as printed circuit boards of the embodiment and a prior art.

However, the printed circuit board of the embodiment differed from that of the prior art in the position of via 8a which connects the decoupling circuit to the board power source layer.

Specifically, since large noise was generated from a power source terminal for a clock output and from a power source terminal near a signal output in the LSI used, a clock output power source and a signal output power source were disposed at a position 8 or 9 power source terminals away from power source terminal 3a (specifically, at the positions of power source terminal 3c and a power source terminal adjacent thereto) in the printed circuit board of the embodiment.

On the other hand, in the printed circuit board of the prior art, the power source terminal for a clock output was disposed at the position of power source terminal 3b, and the power source terminal near a signal output was disposed at the position of power source terminal 3a.

Figure 22:
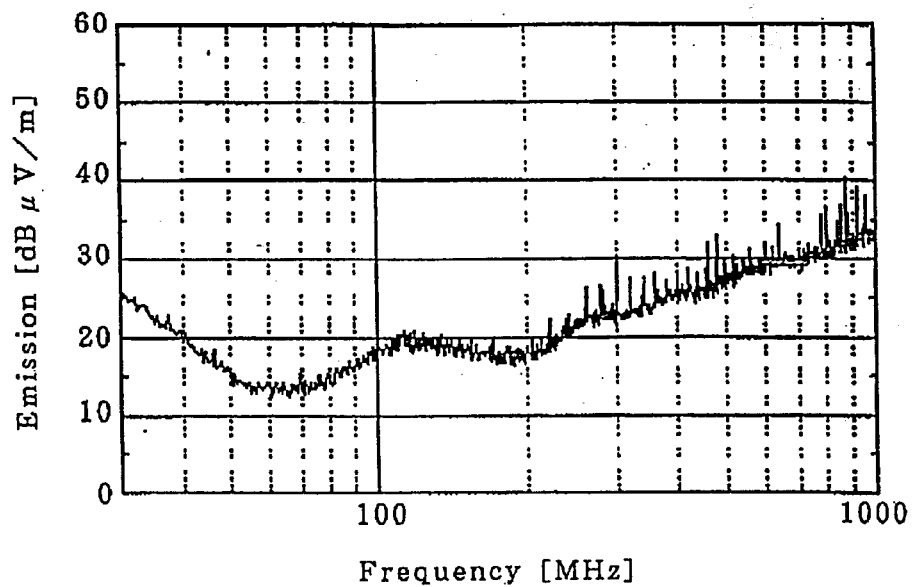
FIG. 22 shows radiation field characteristics of the printed circuit board of the third embodiment.
Figure 23:
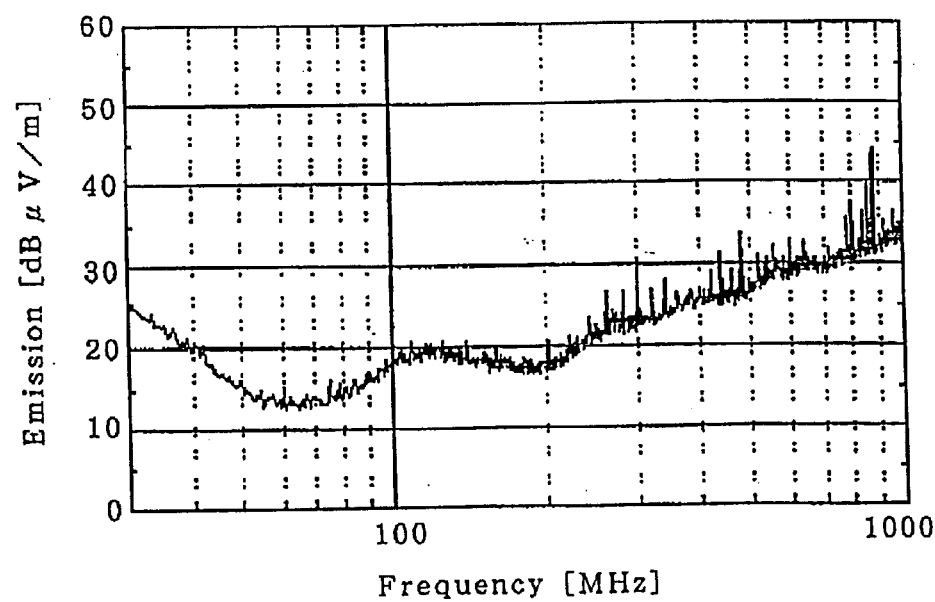
FIG. 23 shows radiation field characteristics of a printed circuit board of the prior art.

FIG. 22 shows the radiation field characteristic of the printed circuit board in the third embodiment, and FIG. 23 shows the radiation field characteristic of the printed circuit board in the prior art.

While a peak is present at approximately 900 MHz in the radiation field characteristic of the printed circuit board of the prior art, such a peak is not present in the radiation field characteristic in the embodiment.

Specifically, the comparison of the two characteristics shows that the effect of suppressing the power source resonance was insufficient when power source terminals with large noise were disposed near the connections to the power source layer (in the prior art), while the effect of suppressing electromagnetic wave was improved when those power source terminals were disposed away from the connections to the power source layer and electrically connected to the multi-layered decoupling circuit (in the embodiment).

In addition, it can be realized that the wiring design which focuses attention on the power source terminals with large noise is important.

Next, description is made for the configuration of a printed circuit board according to a fourth embodiment of the present invention.

Figure 24:
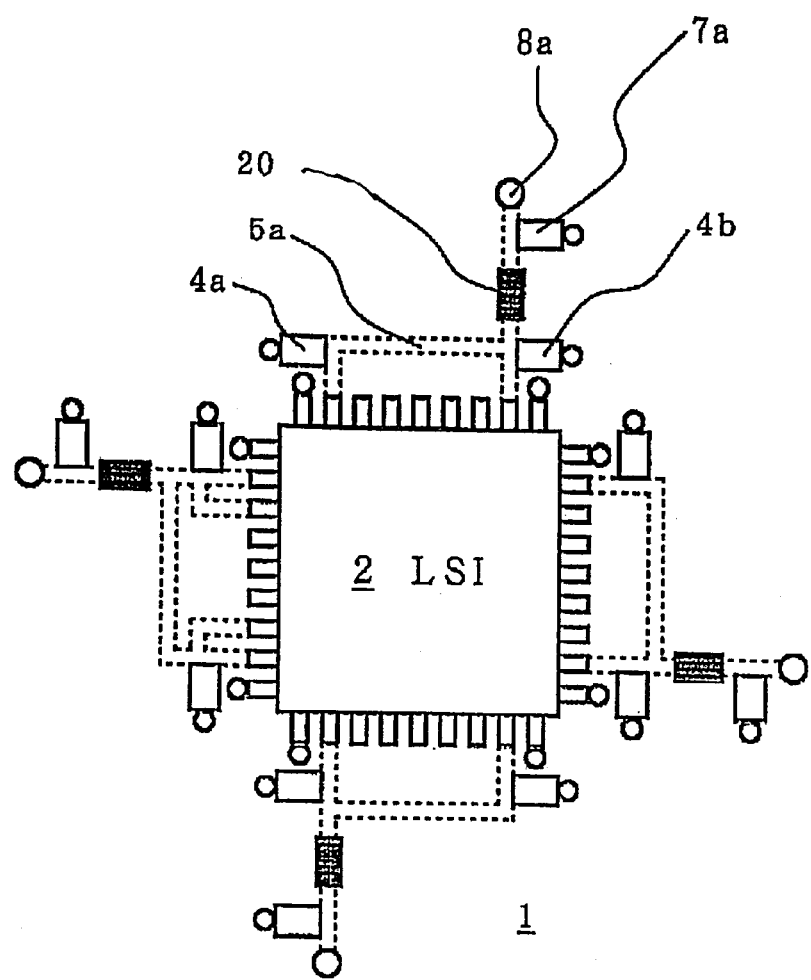
FIG. 24 is the schematic top view of the printed circuit board according to a fourth embodiment.

FIG. 24 is a schematic top view of the printed circuit board according to the fourth embodiment.

In FIG. 24, printed circuit board 1 is an example obtained by modifying the printed circuit board shown in FIG. 1, and inductor 20 is used instead of second power source wiring 6.

As described above, the power source wiring within the decoupling circuit serves as an inductance with large impedance in a frequency range of interest in terms of undesired electromagnetic wave radiation.

The space used for wiring is approximately four times larger than the space for mounting chip parts widely used at present, and it may be difficult to apply the wiring to a board with high mounting density.

In such a case, the use of inductor 20 enables the space to be saved.

However, when the spacing between capacitors is large, such an inductor component cannot be used.

This is because the use of the inductor component in a large spacing requires wiring which serves as a transmission line connected to the component on both sides, and the inductor component connected to the wiring does not necessarily serve as an inductance in a frequency range of interest in terms of electromagnetic wave radiation.

Thus, whether or not the inductor component is used may be determined based on the spacing between two connected capacitors.

Specifically, the inductor components may be used when the spacing is smaller than a value obtained by multiplying 20 mm by the wavelength reduction rate of the board, or otherwise the wiring may be used.

Figure 25:
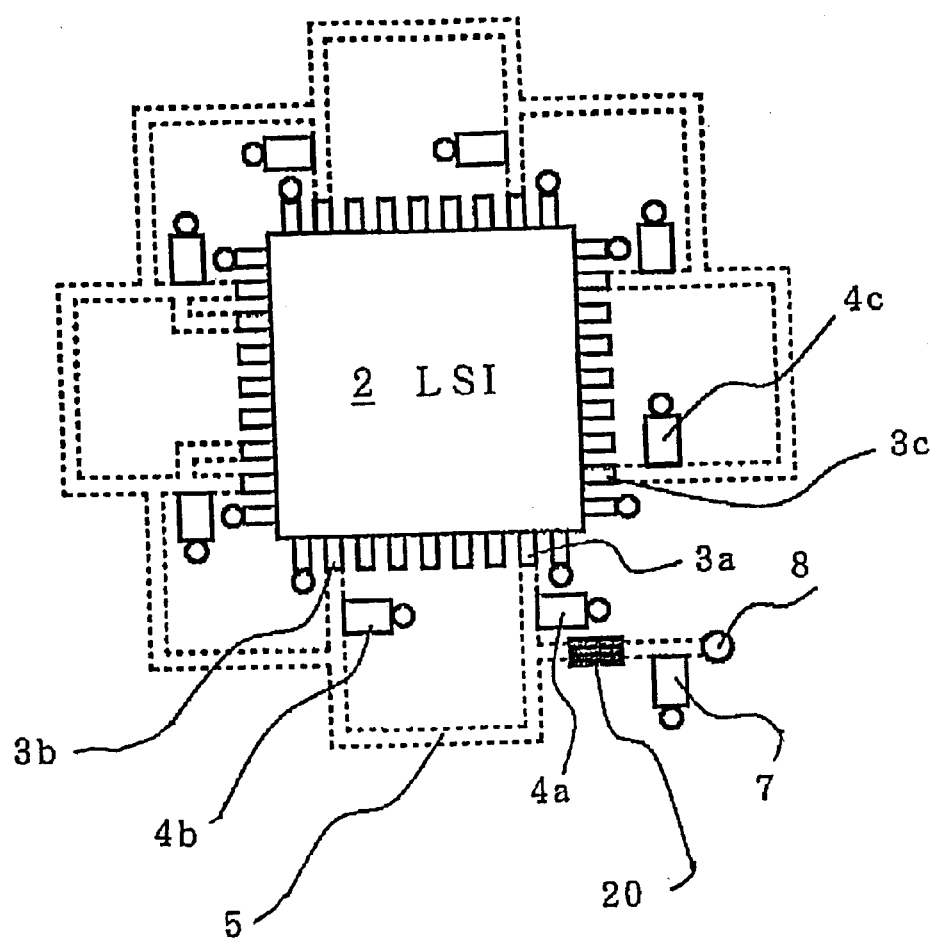
FIG. 25 is the schematic top view of the printed circuit board according to a fifth embodiment.

Next, description is made for a printed circuit board in a fifth embodiment with reference to FIG. 25.

FIG. 25 is a schematic top view of the printed circuit board in the fifth embodiment.

In FIG. 25, printed circuit board 1 is configured to use inductor 20 instead of the second power source wiring, and the other configuration is similar to that of the printed circuit board in the second embodiment.

In printed circuit board 1, inductor 20 electrically connects first capacitor 4a to second capacitor 7 to allow a reduction in space for mounting.

Since inductor 20 is used in a portion of the board, an increase in cost can be minimized.

Next, the effect of suppressing electromagnetic wave in the printed circuit board in the fifth embodiment is described with reference to FIG. 26.

A printed circuit board, not shown, as in the fourth embodiment shown in FIG. 24 was produced similarly to the wiring configuration in the first embodiment, as the printed circuit board in this embodiment.

As inductor 20, a ferrite bead (BLM21P221SG manufactured by Murata Manufacturing Co., Ltd.) was used.

Figure 26:
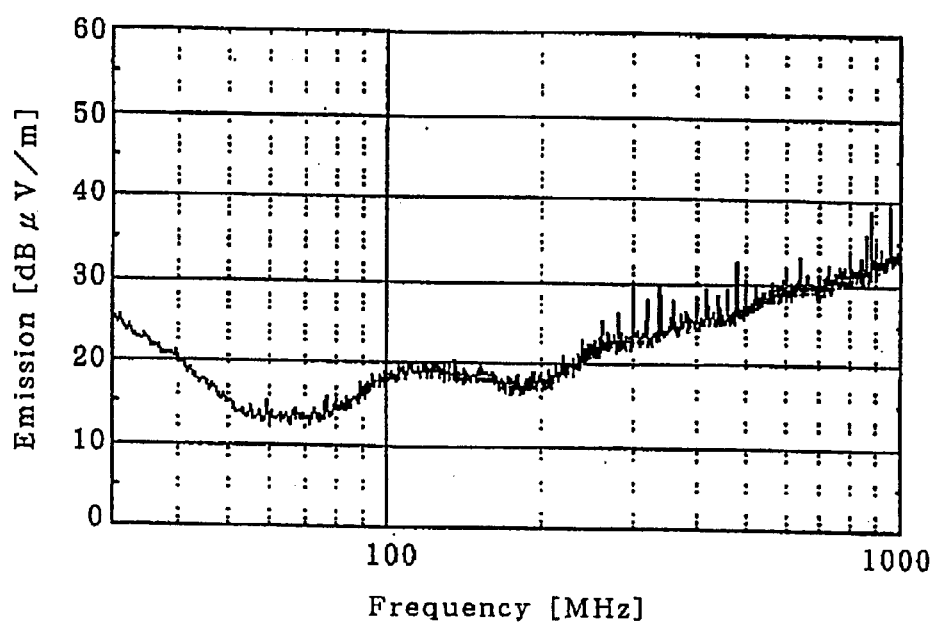
FIG. 26 shows radiation field characteristics of the printed circuit board of a fifth embodiment.

FIG. 26 shows the radiation field characteristic of the printed circuit board in the fifth embodiment.

The result substantially matches the result when the power source wiring was used instead of the ferrite bead shown in FIG. 23, and the radiation suppressing effect can be maintained.

Thus, the printed circuit board in the fifth embodiment allowed a reduction in space for mounting although it caused some increase in cost.

Until now, description has been made for the configuration of the printed circuit boards which focus attention on a power source terminal involving large noise.

However, some power source terminals, for example analog power source terminals, are sensitive, and circuit operations are affected when power source noise is introduced thereto.

When such a terminal is present, it is necessary to isolate terminals with large noise from terminals with susceptibility to noise. A printed circuit board in this case is described as a printed circuit board according to a sixth embodiment with reference to FIG. 24.

Figure 27:
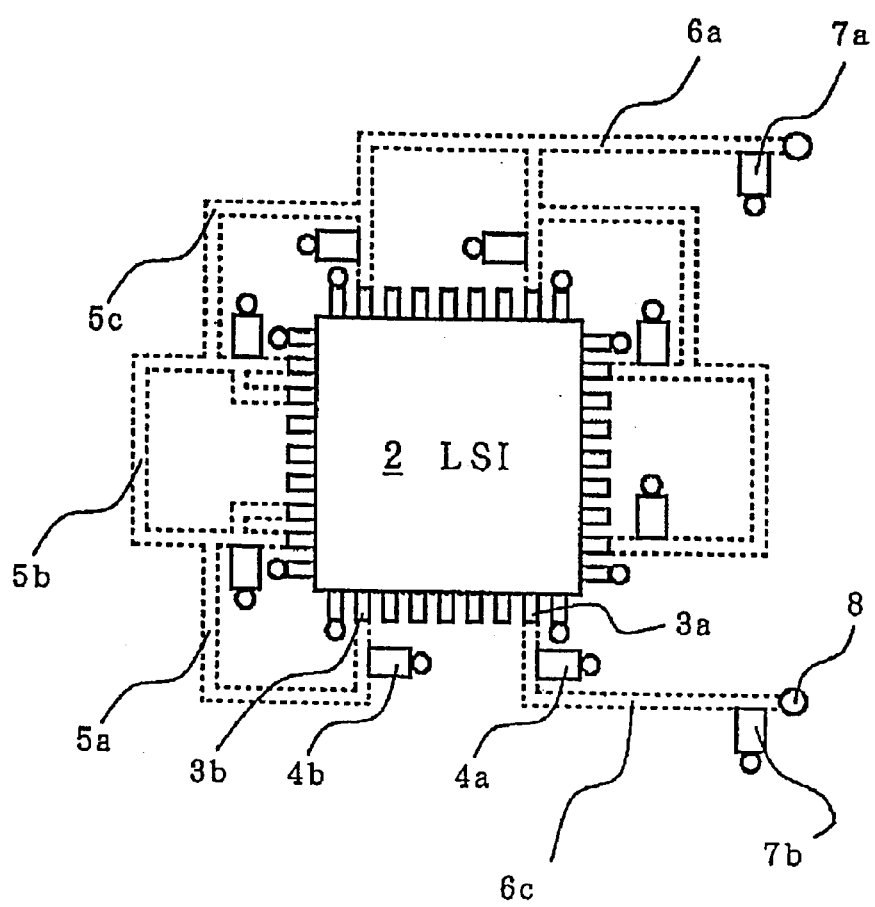
FIG. 27 is the schematic top view of the printed circuit board according to a sixth embodiment.

FIG. 27 is a schematic top view of the printed circuit board according to the sixth embodiment.

In FIG. 27, power source terminal 3a is a terminal with susceptibility to noise (terminal with large noise), and power source terminal 3a is provided with third (fourth) power source wiring 6c and third (fourth) capacitor 7b which are dedicated thereto.

The other configuration is substantially the same as the configuration of the printed circuit board in the third embodiment.

This configuration can realize a printed circuit board which prevents both electromagnetic wave radiation due to power source noise and malfunction of circuit operations.

In the sixth embodiment, although not shown, a decoupling circuit comprising a capacitor-wiring-capacitor arrangement serves to separate an active element from a power source system. Thus, it is easily assumed that they can be isolated only by arranging them separately.

While the decoupling circuit comprising the capacitor-wiring-capacitor arrangement is implemented for power source terminal 3a in this example, it goes without saying that an inductance component can be used instead of the power source wiring in consideration of reduced space for mounting.

In the examples so far described, the decoupling circuit is disposed on the layer where the LSI is disposed.

The printed circuit board of the present invention, however, is not limited thereto, and for example, the decoupling circuit can be disposed on the surface layer opposite to the layer where the LSI is disposed, or on an internal layer. The decoupling circuit may also be disposed under the LSI package on the LSI mounting surface.

However, they are preferably disposed on the same layer since each power source terminal is desirably connected to a first capacitor with as low impedance as possible.

While the printed circuit board of the present invention has been described with examples of a multi-layered board having a signal layer, a power source layer and a ground layer, this can be applied to a multi-layered board without distinction between the power source layer and the ground layer, a double-sided board and a single-sided board, and in these cases, the effect of suppressing resonance of the power source system can be provided similarly by the decoupling circuit.

According to the present invention as described above, the first embodiment, second embodiment and third embodiment can realize a board configuration at low cost and with high effect of suppressing radiation in a printed circuit board on which an LSI is mounted.

In addition, it is possible to realize a board structure to which the decoupling circuit is applied with higher effect on a power source terminal involving large power source noise.

The fourth embodiment can realize a board structure with a minimized increase in cost as well as a reduction in mounting space without reducing the radiation suppressing effect.

Furthermore, the fifth embodiment can realize a board structure with high effect of suppressing radiation while power source terminals with large power source noise are isolated from power source terminals with susceptibility to power source noise at high frequencies.

What is claimed is:

1. A printed circuit board including ground conductors and power source conductors, on which an electronic component provided with two or more power source terminals is mounted, said printed circuit board comprising:

two or more first capacitors for electrically connecting the two or more power source terminals to the ground conductors, respectively;

a first power source wiring for electrically connecting electrodes of adjacent first capacitors of the two or more first capacitors on the power source terminal sides;

a second power source wiring for electrically connecting at least one of electrodes of the two or more first capacitors on the power source terminal side to the power source conductor; and a second capacitor for electrically connecting the power source conductor electrically connected to the second power source wiring to the ground conductor, wherein the first and second power source wirings have characteristic impedances three times or more higher than the impedances of the first and second capacitors in a frequency range in which undesired electromagnetic wave radiation occurs, and the first and second power source wirings have a length which is equal to or larger than a value obtained by multiplying 20 mm by a wavelength reduction rate of the printed circuit board and equal to or smaller than a value obtained by multiplying one quarter the wavelength at an upper limit frequency at which undesired electromagnetic wave radiation occurs, by said wavelength reduction rate.

2. The printed circuit board according to claim 1, wherein said second power source wiring is electrically connected to the electrode of one of said two or more first capacitors on the power source terminal side that is electrically connected to a power source terminal which makes least power source noise out of the two or more power source terminals electrically connected by said first power source wiring.

3. The printed circuit board according to claim 2, wherein said first power source wiring electrically connects the electrodes of said first capacitors on the power source terminal sides electrically connected to a plurality of said power source terminals provided on one side of said electronic component.

4. The printed circuit board according to claim 2, wherein, for a power source terminal that is subject to the influence of power source noise of said at least two power source terminals, a decoupling circuit is formed from the first capacitor electrically connected to the power source terminal, a third power source wiring electrically connected only to the first capacitor and to the power source conductor, and a third capacitor electrically connected to the power source conductor and ground conductor, said third power source wiring has a characteristic impedance three times or more higher than the impedance in said third capacitor in a frequency range in which undesired electromagnetic wave radiation occurs, and said third power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which said undesired electromagnetic wave radiation occurs by said wavelength reduction rate.

5. The printed circuit board according to claim 2, wherein said first power source wiring is electrically connected to said electrodes on the power source terminal sides of said first capacitors adjacent to each other at each corner of said electronic component.

6. The printed circuit board according to claim 2, wherein, for a power source terminal which makes large power source noise of said at least two power source terminals, a decoupling circuit is formed from the first capacitor electrically connected to the power source terminal, a fourth power source wiring electrically connected only to the first capacitor and to the power source conductor, and a fourth capacitor electrically connected to the power source conductor and ground conductor, said fourth power source wiring has a characteristic impedance three times or more higher than the impedance in said fourth capacitor in a frequency range in which undesired electromagnetic wave radiation occurs, and said fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which undesired electromagnetic wave radiation occurs by the wavelength reduction rate.

7. The printed circuit board according to claim 2, wherein an inductor component is used instead of each of said first and second power source wirings.

8. The printed circuit board according to 2, wherein when the spacing between the first capacitors or the spacing between the first capacitor and the second capacitor is smaller than a value obtained by multiplying 20 mm by the wavelength reduction rate of the printed circuit board, an inductor component is used instead of the wiring for connecting the capacitors.

9. The printed circuit board according to claim 3, wherein, for a power source terminal that is subject to the influence of power source noise of said at least two power source terminals, a decoupling circuit is formed from the first capacitor electrically connected to the power source terminal, a third power source wiring electrically connected only to the first capacitor and to the power source conductor, and a third capacitor electrically connected to the power source conductor and ground conductor, said third power source wiring has a characteristic impedance three times or more higher than the impedance in said third capacitor in a frequency range in which undesired electromagnetic wave radiation occurs, and said third power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which said undesired electromagnetic wave radiation occurs by said wavelength reduction rate.

10. The printed circuit board according to claim 1, wherein said first power source wiring electrically connects the electrodes of said first capacitors on the power source terminal sides electrically connected to a plurality of said power source terminals provided on one side of said electronic component.

11. The printed circuit board according to claim 10, wherein said first power source wiring is electrically connected to said electrodes on the power source terminal sides of said first capacitors adjacent to each other at each corner of said electronic component.

12. The printed circuit board according to claim 10, wherein, for a power source terminal that is subject to the influence of power source noise of said at least two power source terminals, a decoupling circuit is formed from the first capacitor electrically connected to the power source terminal, a third power source wiring electrically connected only to the first capacitor and to the power source conductor, and a third capacitor electrically connected to the power source conductor and ground conductor, said third power source wiring has a characteristic impedance three times or more higher than the impedance in said third capacitor in a frequency range in which undesired electromagnetic wave radiation occurs, and said third power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which said undesired electromagnetic wave radiation occurs by said wavelength reduction rate.

13. The printed circuit board according to claim 10, wherein, for a power source terminal which makes large power source noise of said at least two power source terminals, a decoupling circuit is formed from the first capacitor electrically connected to the power source terminal, a fourth power source wiring electrically connected only to the first capacitor and to the power source conductor, and a fourth capacitor electrically connected to the power source conductor and ground conductor, said fourth power source wiring has a characteristic impedance three times or more higher than the impedance in said fourth capacitor in a frequency range in which undesired electromagnetic wave radiation occurs, and said fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which undesired electromagnetic wave radiation occurs by the wavelength reduction rate.

14. The printed circuit board according to claim 10, wherein when the spacing between the first capacitors or the spacing between the first capacitor and the second capacitor is smaller than a value obtained by multiplying 20 mm by the wavelength reduction rate of the printed circuit board, an inductor component is used instead of the wiring for connecting the capacitors.

15. The printed circuit board according to claim 10, wherein an inductor component is used instead of each of said first and second power source wirings.

16. The printed circuit board according to claim 1, wherein said first power source wiring is electrically connected to said electrodes on the power source terminal sides of said first capacitors adjacent to each other at each corner of said electronic component.

17. The printed circuit board according to claim 16, wherein, for a power source terminal which makes large power source noise of said at least two power source terminals, a decoupling circuit is formed from the first capacitor electrically connected to the power source terminal, a fourth power source wiring electrically connected only to the first capacitor and to the power source conductor, and a fourth capacitor electrically connected to the power source conductor and ground conductor, said fourth power source wiring has a characteristic impedance three times or more higher than the impedance in said fourth capacitor in a frequency range in which undesired electromagnetic wave radiation occurs, and said fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which undesired electromagnetic wave radiation occurs by the wavelength reduction rate.

18. The printed circuit board according to claim 16, wherein an inductor component is used instead of each of said first and second power source wirings.

19. The printed circuit board according to claim 16, wherein when the spacing between the first capacitors or the spacing between the first capacitor and the second capacitor is smaller than a value obtained by multiplying 20 mm by the wavelength reduction rate of the printed circuit board, an inductor component is used instead of the wiring for connecting the capacitors.

20. The printed circuit board according to claim 1, wherein, for a power source terminal that is subject to the influence of power source noise of said at least two power source terminals, a decoupling circuit is formed from the first capacitor electrically connected to the power source terminal, a third power source wiring electrically connected only to the first capacitor and to the power source conductor, and a third capacitor electrically connected to the power source conductor and ground conductor, said third power source wiring has a characteristic impedance three times or more higher than the impedance in said third capacitor in a frequency range in which undesired electromagnetic wave radiation occurs, and said third power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which said undesired electromagnetic wave radiation occurs by said wavelength reduction rate.

21. The printed circuit board according to claim 20, wherein, for a power source terminal which makes large power source noise of said at least two power source terminals, a decoupling circuit is formed from the first capacitor electrically connected to the power source terminal, a fourth power source wiring electrically connected only to the first capacitor and to the power source conductor, and a fourth capacitor electrically connected to the power source conductor and ground conductor, said fourth power source wiring has a characteristic impedance three times or more higher than the impedance in said fourth capacitor in a frequency range in which undesired electromagnetic wave radiation occurs, and said fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which undesired electromagnetic wave radiation occurs by the wavelength reduction rate.

22. The printed circuit board according to claim 20, wherein an inductor component is used instead of each of said first, second and third power source wirings.

23. The printed circuit board according to claim 20, wherein when the spacing between the first capacitors or the spacing between the first capacitor and the second, or third capacitor is smaller than a value obtained by multiplying 20 mm by the wavelength reduction rate of the printed circuit board, an inductor component is used instead of the wiring for connecting the capacitors.

24. The printed circuit board according to claim 1, wherein, for a power source terminal which makes large power source noise of said at least two power source terminals, a decoupling circuit is formed from the first capacitor electrically connected to the power source terminal, a fourth power source wiring electrically connected only to the first capacitor and to the power source conductor, and a fourth capacitor electrically connected to the power source conductor and ground conductor, said fourth power source wiring has a characteristic impedance three times or more higher than the impedance in said fourth capacitor in a frequency range in which undesired electromagnetic wave radiation occurs, and said fourth power source wiring has a length which is equal to or larger than a value obtained by multiplying 20 mm by the wavelength reduction rate of the printed circuit board and is equal to or smaller than a value obtained by multiplying one quarter the wavelength at the upper limit frequency at which undesired electromagnetic wave radiation occurs by the wavelength reduction rate.

25. The printed circuit board according to 24, wherein an inductor component is used instead of each of said first, second and fourth power source wirings.

26. The printed circuit board according to 24, wherein when the spacing between the first capacitors or the spacing between the first capacitor and the second or fourth capacitor is smaller than a value obtained by multiplying 20 mm by the wavelength reduction rate of the printed circuit board, an inductor component is used instead of the wiring for connecting the capacitors.

27. The printed circuit board according to claim 1, wherein an inductor component is used instead of each of said first and second power source wirings.

28. The printed circuit board according to 27, wherein when the spacing between the first capacitors or the spacing between the first capacitor and the second capacitor is smaller than a value obtained by multiplying 20 mm by the wavelength reduction rate of the printed circuit board, an inductor component is used instead of the wiring for connecting the capacitors.

29. The printed circuit board according to 1, wherein when the spacing between the first capacitors or the spacing between the first capacitor and the second capacitor is smaller than a value obtained by multiplying 20 mm by the wavelength reduction rate of the printed circuit board, an inductor component is used instead of the wiring for connecting the capacitors.

* * * * *